(12) United States Patent
Kim et al.

(10) Patent No.: US 10,804,329 B2
(45) Date of Patent: Oct. 13, 2020

(54) DISPLAY DEVICE AND METHOD OF DRIVING THE SAME

(71) Applicant: Samsung Display Co., Ltd., Yongin-si, Gyeonggi-do (KR)

(72) Inventors: June Hwan Kim, Daejeon (KR); Tae Young Kim, Seongnam-si (KR); Hyo Jung Kim, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 46 days.

(21) Appl. No.: 16/287,389

(22) Filed: Feb. 27, 2019

(65) Prior Publication Data

US 2019/0305055 A1 Oct. 3, 2019

(30) Foreign Application Priority Data

Mar. 27, 2018 (KR) ........................ 10-2018-0035329

(51) Int. Cl.
*G09G 3/3225* (2016.01)
*H01L 27/32* (2006.01)

(52) U.S. Cl.
CPC ....... *H01L 27/3213* (2013.01); *G09G 3/3225* (2013.01); *H01L 27/322* (2013.01); *H01L 27/3223* (2013.01); *H01L 27/3246* (2013.01); *H01L 27/3248* (2013.01); *H01L 27/3262* (2013.01)

(58) Field of Classification Search
CPC ..... G09G 2320/029; G09G 2300/0413; G09G 3/3233; G09G 2320/043; G09G 2320/046; G09G 2300/0426; G09G 2320/0233; G09G 2300/0452; G09G 2300/0866; G09G 2320/0223; G09G 2320/0295; G09G 3/006; G09G 3/20; G09G 2300/0408; G09G 2300/043; G09G 3/3241; G09G 2330/021; G09G 2300/0439; G09G 2300/046; G09G 2300/0456; G09G 2320/0626; G09G 3/3406; G09G 2330/023; G09G 3/2014; G09G 3/30; G09G 2310/0262; G09G 2320/0276; G09G 2320/0673; H01L 51/5271; H01L 27/3262; H01L 51/5218; H01L 2251/568; H01L 27/3209; H01L 51/5296; G02B 1/11; G02B 27/0093;
(Continued)

(56) References Cited

U.S. PATENT DOCUMENTS 8,962,357 B2 2/2015 Park
8,999,462 B2 4/2015 Hao et al.
(Continued)

FOREIGN PATENT DOCUMENTS

KR 10-2016-0117817 A 10/2016

*Primary Examiner* — Duc Q Dinh
(74) *Attorney, Agent, or Firm* — Lewis Roca Rothgerber Christie LLP

(57) ABSTRACT

A display device may include a first pixel including a first transistor, and a first light emitting element on and electrically connected to the first transistor, a second pixel adjacent the first pixel, the second pixel including a second transistor, and a second light emitting element on and electrically connected to the second transistor, and a reflective member at a layer that is above the first pixel and the second pixel, the reflective member being configured to reflect a light emitted from the second light emitting element to the first transistor.

20 Claims, 9 Drawing Sheets

(58) Field of Classification Search
CPC .... G02B 2027/0132; G02B 2027/0138; G02B 2027/0187; G02B 27/0006; G02B 27/0176
USPC ..................................................... 345/76–84
See application file for complete search history.

(56) References Cited

U.S. PATENT DOCUMENTS

| | | | |
|---|---|---|---|
| 9,830,852 B2* | 11/2017 | Kim ..................... | G09G 3/3225 |
| 2011/0261305 A1* | 10/2011 | Choi ................. | H01L 29/78633 349/114 |
| 2013/0207125 A1* | 8/2013 | Yamazaki ........... | H01L 27/3244 257/80 |

* cited by examiner

DISPLAY DEVICE AND METHOD OF DRIVING THE SAME

CROSS-REFERENCE TO RELATED APPLICATION

This application claims priority to, and the benefit of, Korean Patent Application No. 10-2018-0035329, filed on Mar. 27, 2018 in the Korean Intellectual Property Office (KIPO), the entire disclosure of which is incorporated by reference herein.

BACKGROUND

1. Field

Embodiments relate to a display device, such as an organic light emitting display device including a plurality of pixels, and to a method of driving the display device.

2. Description of the Related Art

An organic light emitting display device may have an organic light emitting element including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall from an excited state to a ground state. The organic light emitting display device may omit a separate light source to generate light, and thus the organic light emitting display device may have relatively small thickness and light weight as well as relatively low power consumption. Furthermore, the organic light emitting display device may have relatively wide viewing angle, high contrast, high response speed, etc.

The organic light emitting display device may include a transistor that supplies current to the organic light emitting element to drive the organic light emitting element. Characteristics of the transistor may change depending on driving of the organic light emitting element.

SUMMARY

An aspect of embodiments of the present invention provides a display device including a transistor with improved characteristics.

An aspect of embodiments of the present invention provides a method of driving a display device for improving characteristics of a transistor.

To achieve one or more aspects of embodiments of the present invention, a display device according to an embodiment may include a first pixel including a first transistor, and a first light emitting element on and electrically connected to the first transistor, a second pixel adjacent the first pixel, the second pixel including a second transistor, and a second light emitting element on and electrically connected to the second transistor, and a reflective member at a layer that is above the first pixel and the second pixel, the reflective member being configured to reflect a light emitted from the second light emitting element to the first transistor.

The reflective member may overlap the second pixel in a plan view.

The first pixel may be a display pixel that displays an image, and the second pixel may be a dummy pixel that does not display an image.

The second pixel may be configured to emit a blue light or a white light.

The second pixel may be configured to emit a light having a wavelength that is shorter than a wavelength of a blue light.

The reflective member may overlap a non-emission area between the first pixel and the second pixel in a plan view.

Each of the first pixel and the second pixel may be a display pixel configured to display an image.

The second pixel may be configured to emit a blue light.

A light emitted from the second light emitting element may be reflected by the reflective member and irradiated to the second transistor.

The reflective member may include a metal or a metal oxide.

A lower surface of the reflective member may have an embossing pattern.

The display device may further include a pixel defining layer separating the first light emitting element from the second light emitting element, and an upper surface of the pixel defining layer may have an embossing pattern.

Each of the first transistor and the second transistor may include a gate electrode on a substrate, a semiconductor layer on, and insulated from, the gate electrode, and a source electrode and a drain electrode on, and electrically connected to, the semiconductor layer.

To achieve one or more aspects of embodiments of the present invention, a method of driving a display device including a first pixel including a first transistor and a first light emitting element located on and electrically connected to the first transistor, a second pixel adjacent the first pixel and including a second transistor and a second light emitting element located on and electrically connected to the second transistor, and a reflective member located on the first pixel and the second pixel according to an embodiment may include driving the first transistor such that a light is emitted from the first light emitting element, and driving the second transistor such that a light emitted from the second light emitting element is reflected by the reflective member and irradiated to the first transistor.

The method may further include driving the second transistor when a driving time of the first transistor is greater than a given amount of time.

The given amount of time may be about 30 minutes.

The method may further include driving the second transistor for a first amount of time when the driving time of the first transistor is a second amount of time that is greater than the given amount of time.

The first amount of time may be about 1 minute, and the second amount of time may be in a range from about 30 minutes to about 2 hours.

The method may further include driving the second transistor for a third amount of time that is greater than the first amount of time when the driving time of the first transistor is a fourth amount of time that is greater than the second amount of time.

The third amount of time may be about 10 minutes, and the fourth amount of time may be in a range from about 2 hours to about 6 hours.

The display device according to one or more embodiments may include the reflective member located on the first and second pixels, reflecting light emitted from the light emitting element of the second pixel, and irradiating the light to the transistor of the first pixel. Therefore, characteristics of the transistor of the first pixel may improve.

In the method of driving the display device according to one or more embodiments, light emitted from the light emitting element of the second pixel may be reflected by the reflective member, and may be irradiated to the transistor of the first pixel that is driven for a given amount of time. Therefore, characteristics of the transistor of the first pixel may improve.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
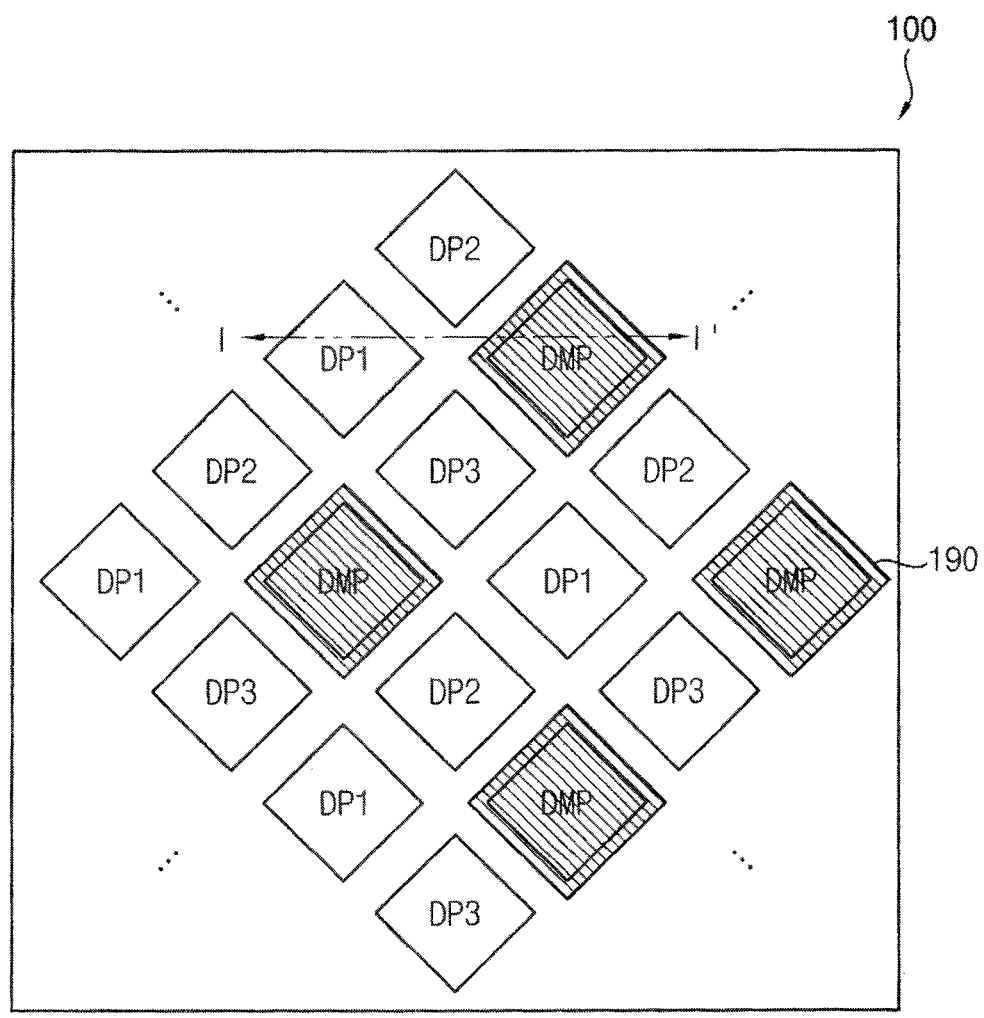
FIG. 1 is a plan view illustrating a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present invention.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

In the following examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment.

Referring to FIG. 1, a display device 100 according to an embodiment may include a plurality of pixels DP1, DP2, DP3, and DMP and a reflective member(s) 190.

The pixels DP1, DP2, DP3, and DMP may be arranged along a first direction and along a second direction crossing the first direction. The pixels DP1, DP2, DP3, and DMP may include display pixels DP1, DP2, and DP3, and a dummy pixel DMP.

Each of the display pixels DP1, DP2, and DP3 may be a pixel that displays an image or a portion thereof. The display pixels DP1, DP2, and DP3 may emit light to the front of the display device 100, and a user may recognize an image that is a combination of the light. The display pixels DP1, DP2, and DP3 may include a first display pixel DP1, a second display pixel DP2, and a third display pixel DP3.

The first display pixel DP1, the second display pixel DP2, and the third display pixel DP3 may emit visible light having different respective colors. For example, the first display pixel DP1, the second display pixel DP2, and the third display pixel DP3 may emit red light, green light, and blue light, respectively.

The dummy pixel DMP may be a pixel that does not display an image. The dummy pixel DMP may emit light toward the front of the display device 100, and the light may be reflected or blocked by the reflective member 190. Accordingly, a user may not recognize or notice the light emitted from the dummy pixel DMP.

In an embodiment, the dummy pixel DMP may emit any one of blue light and white light. In another embodiment, the dummy pixel DMP may emit light having a wavelength that is shorter than a wavelength of blue light. For example, the dummy pixel DMP may emit light having a wavelength shorter than about 400 nm.

Three display pixels DP1, DP2, and DP3 and one dummy pixel DMP may compose a single unit pixel. However, the embodiments of the present invention are not limited thereto. A single unit pixel may include two display pixels, or may include four or more display pixels, and may also include two or more dummy pixels.

The reflective member(s) 190 may be located on or above the pixels DP1, DP2, DP3, and DMP. The reflective member 190 may overlap the dummy pixel DMP in a plan view (e.g., while not overlapping pixels DP1, DP2, or DP3). Accordingly, light emitted from the dummy pixel DMP may be reflected by the reflective member 190 as described above. The reflective member 190 may be patterned for each dummy pixel DMP.

Figure 2:
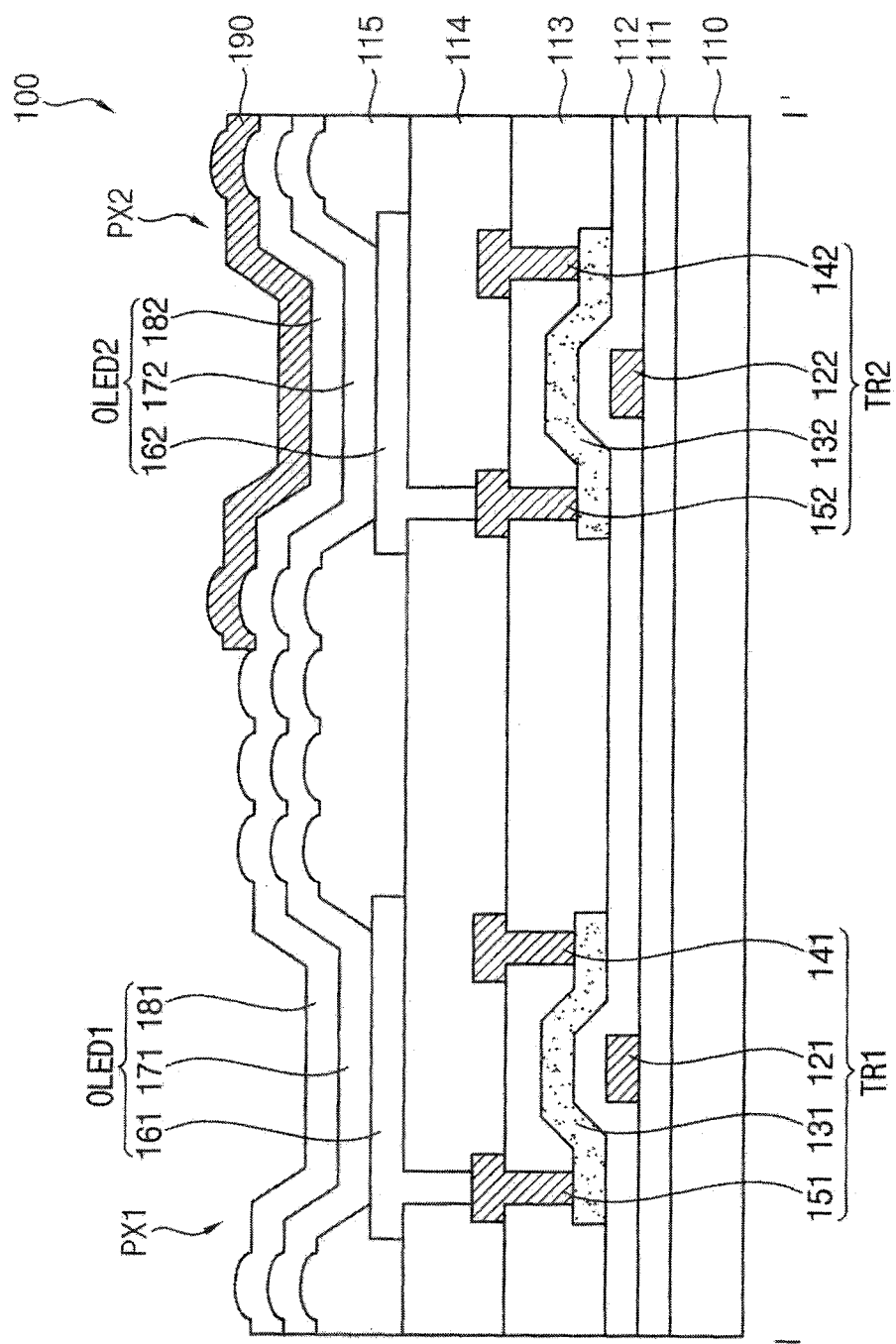
FIG. 2 is a cross-sectional view illustrating the display device in FIG. 1 taken along the line I-I'.

FIG. 2 is a cross-sectional view illustrating the display device in FIG. 1 taken along the line I-I'.

Referring to FIG. 2, the display device 100 may include a substrate 110, a first pixel PX1, a second pixel PX2, and the reflective member 190.

The substrate 110 may be formed of glass, quartz, plastic, or the like.

A buffer layer 111 may be located on the substrate 110. The buffer layer 111 may prevent impurities from permeating into the display device 100 through the substrate 110. Further, the buffer layer 111 may provide a planarized surface above the substrate 110. Alternatively, the buffer layer 111 may be omitted.

The first pixel PX1 and the second pixel PX2 may be located on the substrate 110. The first pixel PX1 may include a first transistor TR1 and a first light emitting element OLED1, and the second pixel PX2 may include a second transistor TR2 and a second light emitting element OLED2.

The first pixel PX1 and the second pixel PX2 may correspond to the first display pixel DP1 in FIG. 1 and the dummy pixel DMP in FIG. 1, respectively. In the present example, FIG. 2 exemplifies that the first pixel PX1 corresponds to the first display pixel DP1. However, embodiments of the present invention are not limited thereto, and the first pixel PX1 may correspond to the second display pixel DP2 in FIG. 1 or to the third display pixel DP3 in FIG. 1.

The first transistor TR1 and the second transistor TR2 may be located on the buffer layer 111. The first transistor TR1 may include a first gate electrode 121, a first semiconductor layer 131, a first source electrode 141, and a first drain electrode 151. The second transistor TR2 may include a second gate electrode 122, a second semiconductor layer 132, a second source electrode 142, and a second drain electrode 152.

The first gate electrode 121 and the second gate electrode 122 may be located on the buffer layer 111. The first gate electrode 121 and the second gate electrode 122 may include gold (Au), silver (Ag), copper (Cu), nickel (Ni), platinum (Pt), palladium (Pd), aluminum (Al), molybdenum (Mo), and/or titanium (Ti).

A gate insulation layer 112 may be located on the first gate electrode 121 and the second gate electrode 122. The gate insulation layer 112 may be formed on the buffer layer 111 while covering the first gate electrode 121 and the second gate electrode 122. The gate insulation layer 112 may include silicon nitride ($SiN_x$), silicon oxide ($SiO_x$), or the like.

The first semiconductor layer 131 and the second semiconductor layer 132 may be located on the gate insulation layer 112. A portion of the first semiconductor layer 131 may overlap the first gate electrode 121, and a portion of the second semiconductor layer 132 may overlap the second gate electrode 122. The first semiconductor layer 131 and the second semiconductor layer 132 may be insulated from the first gate electrode 121 and the second gate electrode 122, respectively, by the gate insulation layer 112. The first semiconductor layer 131 and the second semiconductor layer 132 may include amorphous silicon, polycrystalline silicon, or the like. Alternatively, the first semiconductor layer 131 and the second semiconductor layer 132 may include an oxide semiconductor.

An insulation interlayer 113 may be located on the first semiconductor layer 131 and the second semiconductor layer 132. The insulation interlayer 113 may be formed on the gate insulation layer 112 while covering the first semiconductor layer 131 and the second semiconductor layer 132. The insulation interlayer 113 may include silicon nitride ($SiN_x$), silicon oxide ($SiO_x$), or the like.

The first source electrode 141, the first drain electrode 151, the second source electrode 142, and the second drain electrode 152 may be located on the insulation interlayer 113. The first source electrode 141 and the first drain electrode 151 may be electrically connected to the first semiconductor layer 131. The second source electrode 142 and the second drain electrode 152 may be electrically connected to the second semiconductor layer 132. For example, the first source electrode 141 and the first drain electrode 151 may be in contact with the first semiconductor layer 131 through contact holes formed in the insulation interlayer 113. The second source electrode 142 and the second drain electrode 152 may be in contact with the second semiconductor layer 132 through contact holes formed in the insulation interlayer 113.

The first source electrode 141, the first drain electrode 151, the second source electrode 142, and the second drain electrode 152 may include Au, Ag, Cu, Ni, Pt, Pd, Al, Mo, and/or Ti. For example, each of the first source electrode 141, the first drain electrode 151, the second source electrode 142, and the second drain electrode 152 may be formed of a multi-layered structure, such as Mo/Al/Mo or Ti/Al/Ti.

FIG. 2 exemplifies that each of the first transistor TR1 and the second transistor TR2 has a bottom-gate structure. However, each of the first transistor TR1 and the second transistor TR2 may have a top-gate structure.

A planarization layer 114 may be located on the first source electrode 141, the first drain electrode 151, the second source electrode 142, and the second drain electrode 152. The planarization layer 114 may be formed on the insulation interlayer 113 while covering the first transistor TR1 and the second transistor TR2. The planarization layer 114 may provide a planarized surface above the insulation layer 113. The planarization layer 114 may include a photosensitive organic material. For example, the planarization layer 114 may be formed of photoresist, polyacrylate resin, polyimide resin, siloxane resin, acrylic resin, epoxy resin, or the like.

The first light emitting element OLED1 and the second light emitting element OLED2 may be located on the planarization layer 114. The first light emitting element OLED1 may include a first pixel electrode 161, a first intermediate layer 171, and a first opposite electrode 181. The second light emitting element OLED2 may include a second pixel electrode 162, a second intermediate layer 172, and a second opposite electrode 182.

The first light emitting element OLED1 and the second light emitting element OLED2 may be electrically connected to the first transistor TR1 and the second transistor TR2, respectively. The first light emitting element OLED1 and the second light emitting element OLED2 may emit light based on current supplied from the first transistor TR1 and the second transistor TR2, respectively. The present embodiment exemplifies that each of the first light emitting element OLED1 and the second light emitting element OLED2 is an organic light emitting element. However, each of the first light emitting element OLED1 and the second light emitting element OLED2 may be a liquid crystal element in another embodiment.

The first pixel electrode 161 and the second pixel electrode 162 may be located on the planarization layer 114. The first pixel electrode 161 and the second pixel electrode 162 may be patterned for each pixel. The first pixel electrode 161 may be in contact with the first drain electrode 151. The second pixel electrode 162 may be in contact with the second drain electrode 152. For example, the first pixel electrode 161 may be in contact with the first drain electrode 151 through a contact hole formed in the planarization layer 114, and the second pixel electrode 162 may be in contact with the second drain electrode 152 through a contact hole formed in the planarization layer 114. Each of the first pixel electrode 161 and the second pixel electrode 162 may be a reflective electrode. Each of the first pixel electrode 161 and the second pixel electrode 162 may include a reflective layer formed of silver (Ag), magnesium (Mg), aluminum (Al), platinum (Pt), palladium (Pa), gold (Au), nickel (Ni), neodymium (Nd), iridium (Ir), and/or chrome (Cr) and a transmitting layer formed of indium tin oxide (ITO), indium zinc oxide (IZO), zinc oxide (ZnO), and/or indium oxide ($In_2O_3$). For example, each of the first pixel electrode 161 and the second pixel electrode 162 may be formed of a multi-layered structure such as ITO/Ag/ITO.

A pixel defining layer 115 may be located on (e.g., on edges of) the first pixel electrode 161 and the second pixel electrode 162. The pixel defining layer 115 may include openings exposing a portion of the first pixel electrode 161 and a portion of the second pixel electrode 162, respectively. The pixel defining layer 115 may separate the first light emitting element OLED1 from the second light emitting element OLED2.

The pixel defining layer 115 may include a photosensitive organic material. For example, the pixel defining layer 115 may be formed of photoresist, polyacrylate resin, polyimide resin, siloxane resin, acrylic resin, epoxy resin, or the like.

In an embodiment, an upper surface of the pixel defining layer 115 may have an embossing pattern. The embossing pattern may have a shape protruding toward top of the pixel defining layer 115.

The first intermediate layer 171 may be located on the first pixel electrode 161, and the second intermediate layer 172 may be located on the second pixel electrode 162. Each of the first intermediate layer 171 and the second intermediate layer 172 may include an organic light emitting layer. The organic light emitting layer may be formed for each pixel. In an embodiment, each of the first intermediate layer 171 and the second intermediate layer 172 may further include a hole injection layer (HIL) and/or a hole transport layer (HTL) located under the organic light emitting layer. Further, each of the first intermediate layer 171 and the second intermediate layer 172 may further include an electron transport layer (ETL) and/or an electron injection layer (EIL) located over the organic light emitting layer. The HIL, the HTL, the ETL, and the EIL may be commonly provided for the pixels.

The first intermediate layer 171 may emit red light. However, the present embodiment is not limited thereto. The first intermediate layer 171 may emit green light or blue light.

In an embodiment, the second intermediate layer 172 may emit any one of blue light and white light. In another embodiment, the second intermediate layer 172 may emit light having a wavelength that is shorter than a wavelength of blue light. For example, the second intermediate layer 172 may emit light having a wavelength that is shorter than about 400 nm. Accordingly, the second intermediate layer 172 may emit light having relatively higher energy.

The first opposite electrode 181 may be located on the first intermediate layer 171, and the second opposite electrode 182 may be located on the second intermediate layer 172. The first opposite electrode 181 and the second opposite electrode 182 may be commonly provided for the pixels. Each of the first opposite electrode 181 and the second opposite electrode 182 may be a transmitting electrode. For example, the first opposite electrode 181 and the second opposite electrode 182 may be formed of metal, metal alloy, metal nitride, conductive metal oxide, transparent conductive material, or the like.

The reflective member 190 may be located on or above the second pixel PX2. For example, the reflective member 190 may be located on the second opposite electrode 182. The reflective member 190 may overlap the second pixel PX2 in a plan view.

The reflective member 190 may include any one of metal and metal oxide. For example, the reflective member 190 may be formed of metal such as silver (Ag) or the like, or metal oxide such as aluminum oxide ($AlO_x$), chrome oxide ($CrO_x$), or the like.

In an embodiment, a lower surface of the reflective member 190 may have an embossing pattern. The embossing pattern may have a shape protruding toward top of the reflective member 190. The intermediate layers 171 and 172 and the opposite electrodes 181 and 182, which are commonly provided for the pixels, may be formed along a profile of the upper surface of the pixel defining layer 115 on which the embossing pattern is formed. Accordingly, the embossing pattern may be formed on the lower surface of the reflective member 190, which is located over the pixel defining layer 115 having the embossing pattern is formed on the upper surface thereof.

Figure 3:
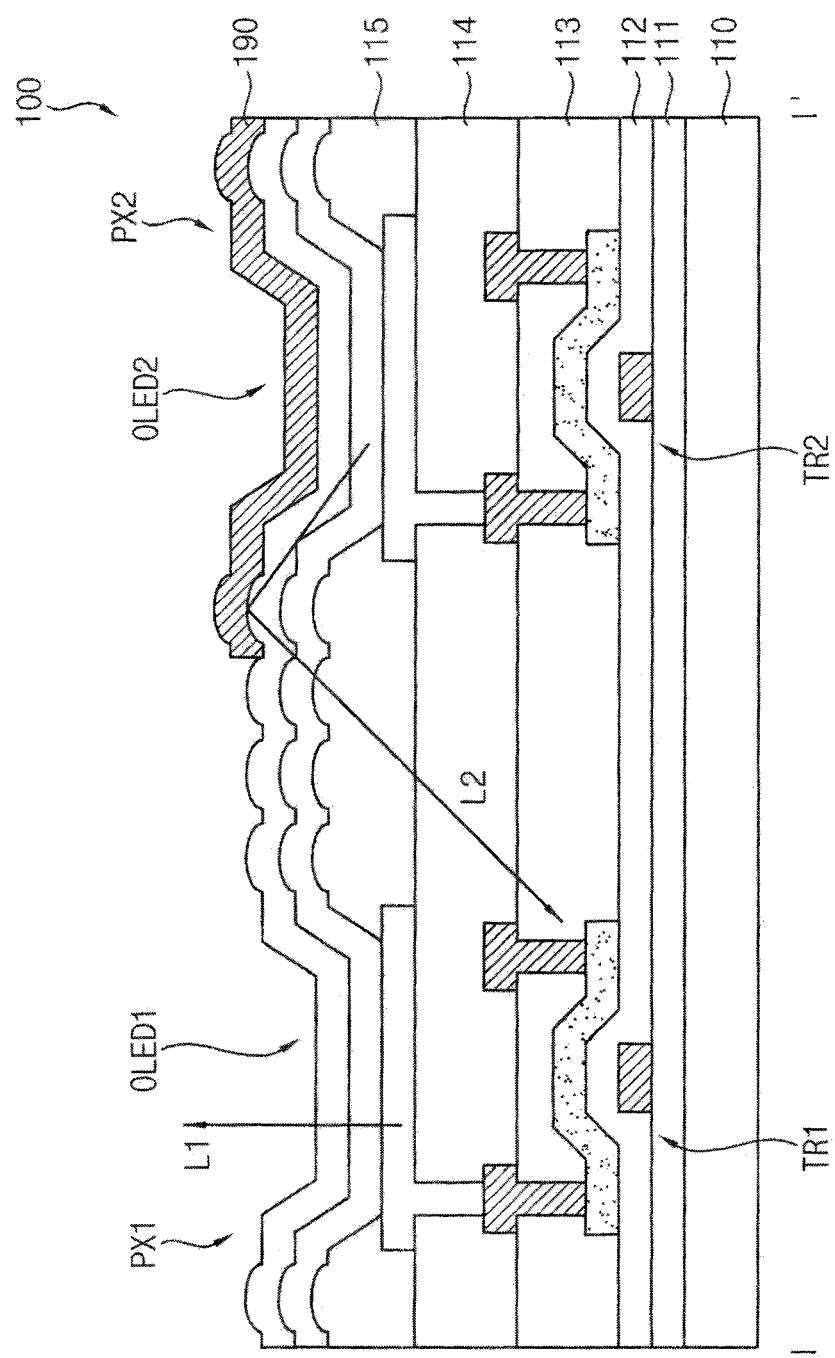
FIG. 3 is a cross-sectional view illustrating radiation of light in the display device in FIG. 2.

FIG. 3 is a cross-sectional view illustrating radiation of light in the display device in FIG. 2.

Referring to FIG. 3, the first light emitting element OLED1 of the first pixel PX1 may emit first light L1 based on current supplied from the first transistor TR1. The first light L1 may be red light, green light, or blue light. The first light L1 may be emitted to the front of the display device 100, and a user may recognize an image.

The second light emitting element OLED2 of the second pixel PX2 may emit second light L2 based on current supplied from the second transistor TR2. The second light L2 may be emitted toward the front of the display device 100, and may be reflected by the reflective member 190. The reflected second light L2 may be irradiated to the first transistor TR1. The second light L2 may be blue light, white light, or light having a wavelength that is shorter than a wavelength of blue light. A wavelength of the second light L2 may be shorter than a wavelength of the first light L1. Accordingly, the second light L2 may have higher energy than that of the first light L1.

When the second light L2 is reflected by the embossing pattern formed on the lower surface of the reflective member 190, an angle of reflection of the second light L2 may increase or decrease. Accordingly, the range of irradiation of the reflected second light L2 may expand.

When the first pixel PX1 emits light for more than a given or predetermined time, characteristics of the first transistor TR1 may change, and a driving range of the first transistor TR1 may increase. In the present embodiment, the second light L2 having relatively higher energy may be reflected by the reflective member 190, and may be irradiated to the first transistor TR1, thereby causing the driving range of the first transistor TR1 to decrease. Accordingly, characteristics of the first transistor TR1 may improve.

Figure 4:
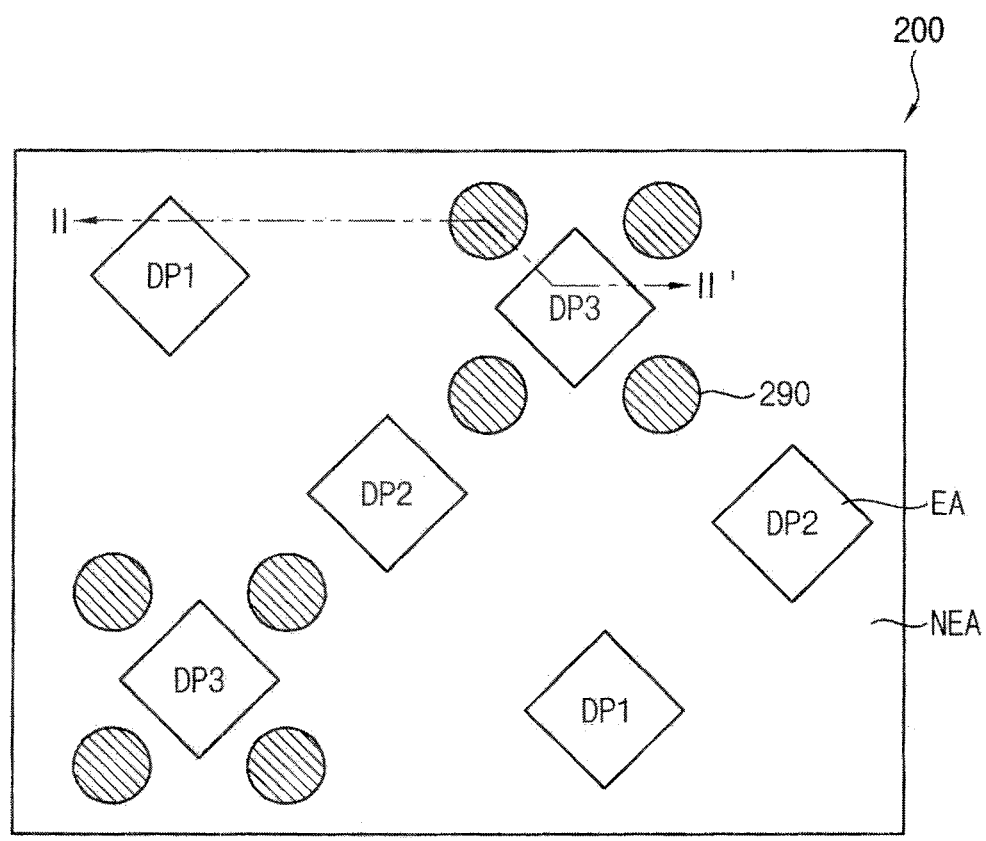
FIG. 4 is a plan view illustrating a display device according to an embodiment.

FIG. 4 is a plan view illustrating a display device according to an embodiment.

Referring to FIG. 4, a display device 200 according to an embodiment may include a plurality of display pixels DP1, DP2, and DP3 and a reflective member 290.

The display pixels DP1, DP2, and DP3 may be arranged along a first direction, and along a second direction crossing the first direction. Each of the display pixels DP1, DP2, and DP3 may be a pixel that displays an image or a portion of an image. The display pixels DP1, DP2, and DP3 may emit light to the front of the display device 200, and a user may recognize an image that is a combination of the light. The display pixels DP1, DP2, and DP3 may include a first display pixel DP1, a second display pixel DP2, and a third display pixel DP3.

The first display pixel DP1, the second display pixel DP2, and the third display pixel DP3 may emit visible light having different respective colors. For example, the first display pixel DP1, the second display pixel DP2, and the third display pixel DP3 may emit red light, green light, and blue light, respectively. Accordingly, an area in which the display pixels DP1, DP2, and DP3 are located may be defined as an emission area EA, and an area between the display pixels DP1, DP2, and DP3, from which light is not emitted, may be defined as a non-emission area NEA.

Three display pixels DP1, DP2, and DP3 may compose a single unit pixel. However, the embodiments of the present invention are not limited thereto. A single unit pixel may include two display pixels, or may include four or more display pixels.

The reflective member 290 may be located above the display pixels DP1, DP2, and DP3 (e.g., on or above in a cross sectional view). The reflective member 290 may overlap the non-emission area NEA in a plan view. For example, the reflective member 290 may be located adjacent to the third display pixel DP3 in the non-emission area NEA. Accordingly, light emitted from the third display pixel DP3 may be reflected by the reflective member 290. FIG. 4 exemplifies that four reflective members 290 surround the third display pixel DP3. However, the number and the arrangement of the reflective members 290 are not limited thereto.

Figure 5:
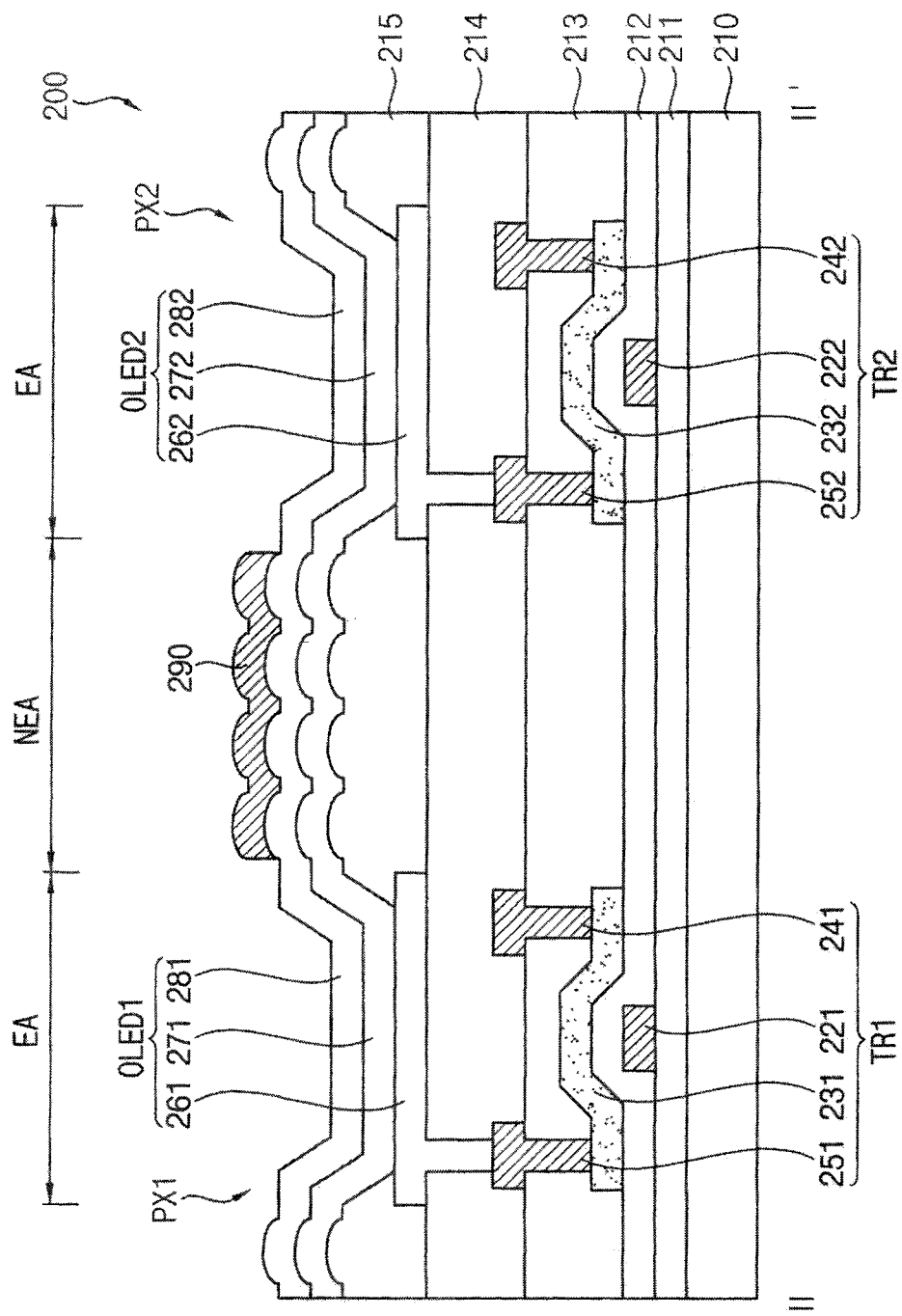
FIG. 5 is a cross-sectional view illustrating the display device in FIG. 4 taken along the line II-II'.

FIG. 5 is a cross-sectional view illustrating the display device in FIG. 4 taken along the line II-II'.

Referring to FIG. 5, the display device 200 may include a substrate 210, a first pixel PX1, a second pixel PX2, and the reflective member 290. Repeated detailed descriptions on elements of the display device 200 according to an embodiment with reference to FIG. 5 that are substantially the same as or similar to those of the display device 100 according to an embodiment with reference to FIG. 2 will be omitted.

The substrate 210 may include the emission area EA and the non-emission area NEA.

The first pixel PX1 and the second pixel PX2 may be located on the substrate 210 in the emission area EA. The non-emission area NEA may be located between the first pixel PX1 and the second pixel PX2. The first pixel PX1 and the second pixel PX2 may correspond to the first display pixel DP1 in FIG. 4 and the third display pixel DP3 in FIG. 4, respectively. FIG. 5 exemplifies that the first pixel PX1 corresponds to the first display pixel DP1. However, embodiments of the present invention are not limited thereto. For example, the first pixel PX1 may correspond to the second display pixel DP2 in FIG. 4.

A first intermediate layer 271 of a first light emitting element OLED1 may emit red light. However, the present embodiment is not limited thereto. For example, the first intermediate layer 271 may emit green light.

A second intermediate layer 272 of a second light emitting element OLED2 may emit blue light. Accordingly, the second intermediate layer 272 may emit light having higher energy than that of the first intermediate layer 271.

The reflective member 290 may be located on the first pixel PX1 and the second pixel PX2. For example, the reflective member 290 may be located on second opposite electrodes 281 and 282 commonly formed for the pixels. The reflective member 290 may overlap the non-emission area NEA in a plan view.

Figure 6:
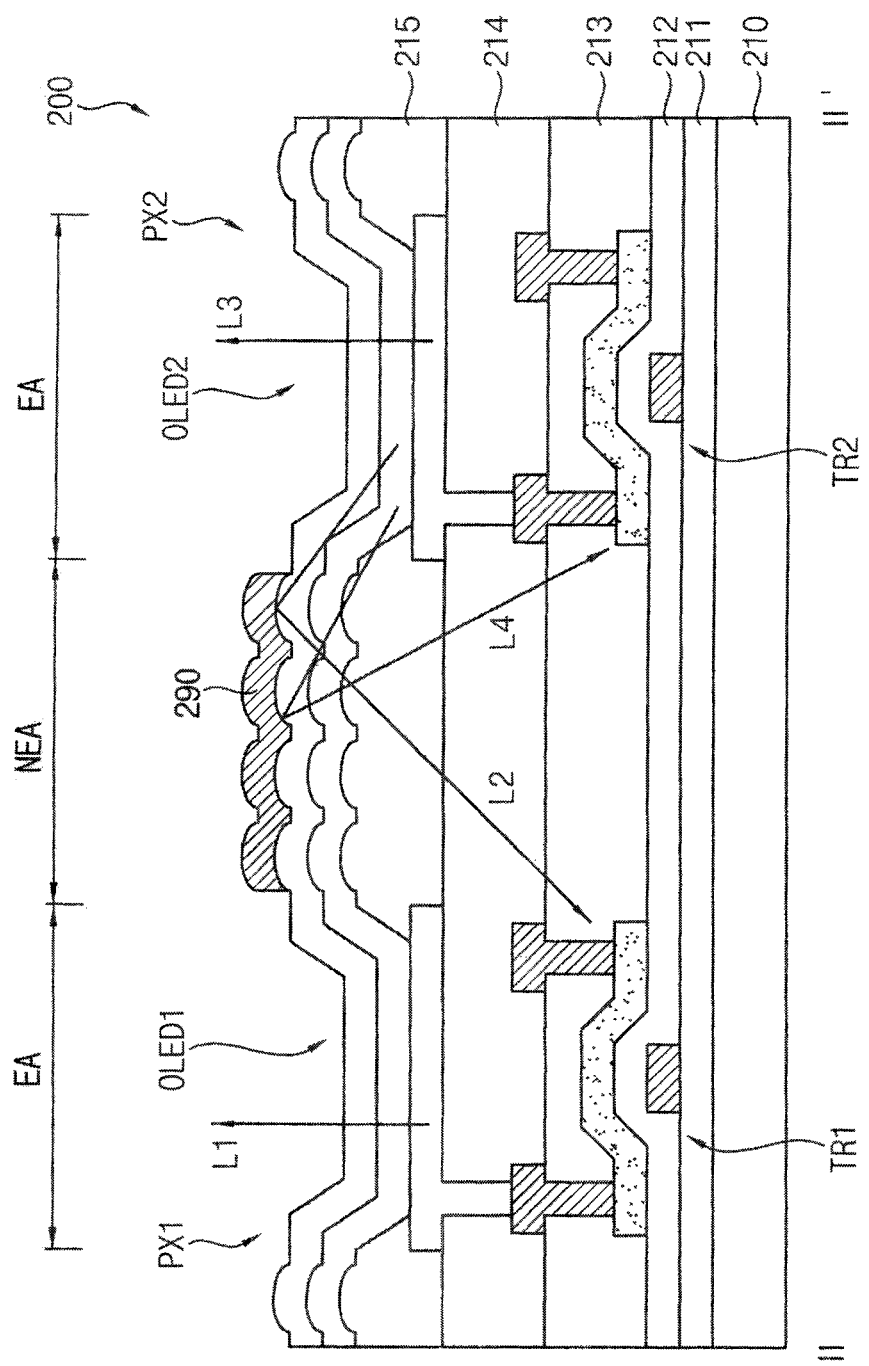
FIG. 6 is a cross-sectional view illustrating radiation of light in the display device in FIG. 5.

FIG. 6 is a cross-sectional view illustrating radiation of light in the display device in FIG. 5.

Referring to FIG. 6, the first light emitting element OLED1 of the first pixel PX1 may emit first light L1 based on current supplied from the first transistor TR1. The first light L1 may be red light or green light. The first light L1 may be emitted to the front of the display device 200, and a user may recognize an image.

The second light emitting element OLED2 of the second pixel PX2 may emit second light L2, third light L3, and fourth light L4 based on current supplied from the second transistor TR2. The second light L2, the third light L3, and the fourth light L4 may be blue light. The third light L3 may be emitted to the front of the display device 200, and a user may recognize an image corresponding thereto. The second light L2 and the fourth light L4 may be emitted toward the front of the display device 200, and may be reflected by the reflective member 290. The reflected second light L2 may be irradiated to the first transistor TR1, and the reflected fourth light L4 may be irradiated to the second transistor TR2. When the second light L2 and the fourth light L4 are reflected by an embossing pattern formed on an lower surface of the reflective member 290, angles of reflection of the second light L2 and the fourth light L4 may increase or decrease. Accordingly, the ranges of irradiation of the reflected second and fourth light L2 and L4 may expand.

When the first pixel PX1 and the second pixel PX2 emit light for more than a given amount of time, characteristics of the first transistor TR1 and the second transistor TR2 may change, and driving ranges of the first transistor TR1 and the second transistor TR2 may increase. In this case, the second light L2 and the fourth light L4 having relatively higher energy may be reflected by the reflective member 290, and may be irradiated to the first transistor TR1 and the second transistor TR2, respectively, thereby potentially decreasing the driving ranges of the first transistor TR1 and the second transistor TR2. Accordingly, characteristics of the first transistor TR1 and the second transistor TR2 may improve.

Figure 7:
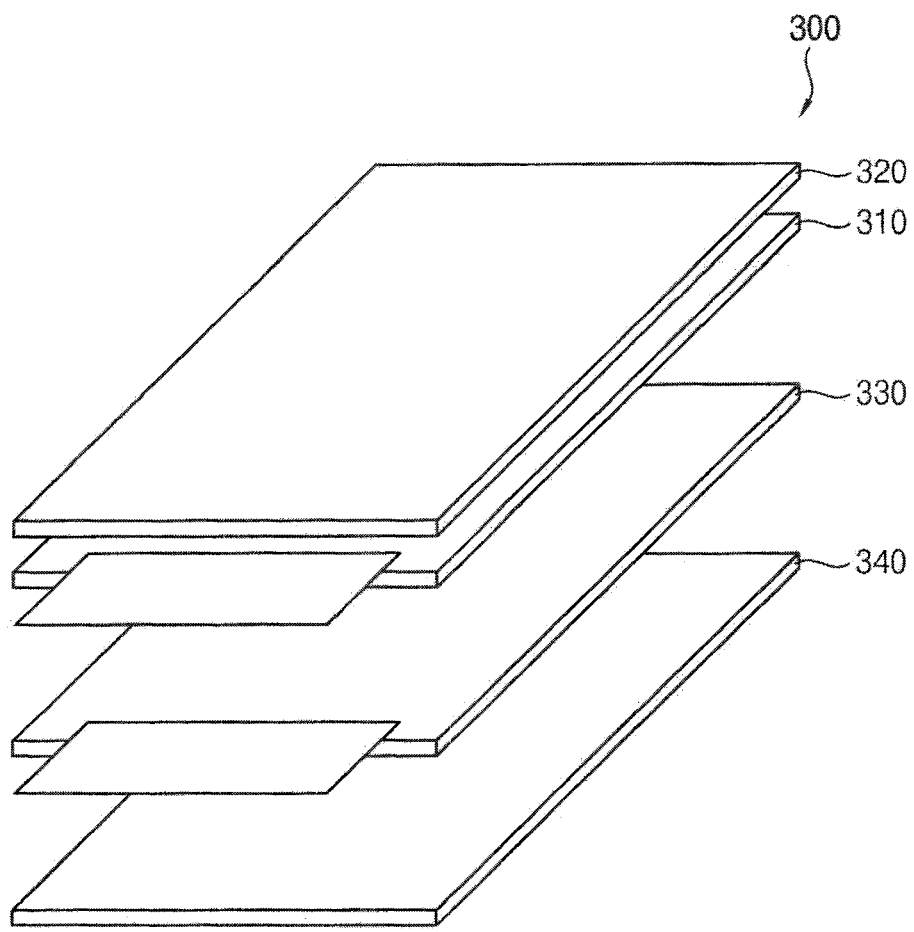
FIG. 7 is an exploded perspective view illustrating a display device according to an embodiment.

FIG. 7 is an exploded perspective view illustrating a display device according to an embodiment.

Referring to FIG. 7, a display device 300 according to an embodiment may include a display panel 310, a window member 320, a light irradiation member 330, and a functional member 340.

The display panel 310 may display an image. In the present embodiment, the display panel 310 may be an organic light emitting display panel.

The window member 320 may be located on a front surface of the display panel 310. An image displayed from the display panel 310 may be provided to a user through the window member 320.

The light irradiation member 330 may be located on a rear surface of the display panel 310. The light irradiation member 330 may irradiate light to the display panel 310. The light irradiation member 330 may emit non-visible light having a wavelength that is shorter than a wavelength of blue light. For example, the light irradiation member 330 may emit non-visible light having a wavelength that is shorter than about 400 nm. Accordingly, the light irradiation member 330 may irradiate light having relatively higher energy to the display panel 310. The light irradiation member 330 may include a light source, a light guide panel, or the like.

The functional member 340 may be located on a rear surface of the light irradiation member 330. The functional member 340 may include a cushion layer softening the impact to the display panel 310, a black layer preventing elements from being recognized by a user, a heat dissipation layer for dissipating heat transferred from the display panel 310 to outside, or the like.

Figure 8:
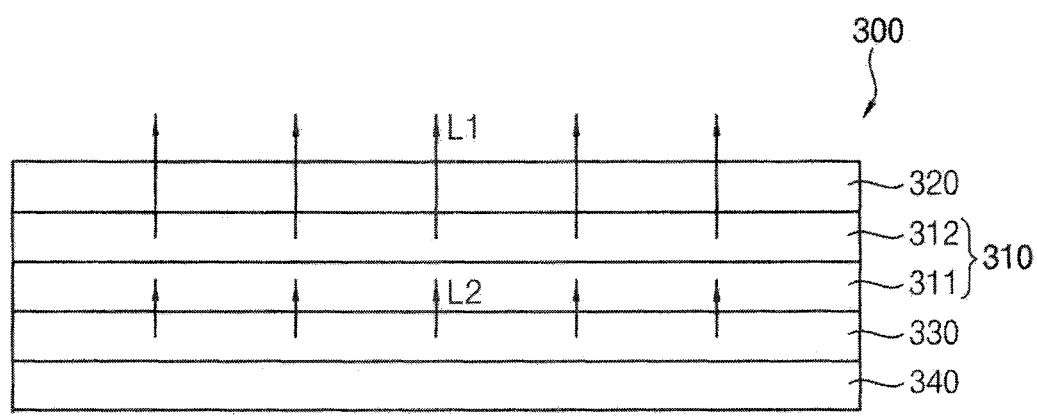
FIG. 8 is a cross-sectional view illustrating radiation of light in the display device in FIG. 7.

FIG. 8 is a cross-sectional view illustrating radiation of light in the display device in FIG. 7.

Referring to FIG. 8, the display panel 310 may include a driving unit 311 including a transistor, and a display unit 312 including a light emitting element. The display unit 312 may be driven by the driving unit 311, and may emit first light L1. The first light L1 may be red light, green light, or blue light. The first light L1 may be emitted to the front of the display device 300 through the window member 320, and a user may recognize an image.

The light irradiation member 330 may emit second light L2 to the driving unit 311 of the display panel 310. For example, the second light L2 may be irradiated to the transistor included in the driving unit 311. The second light L2 may be light having a wavelength that is shorter than a wavelength of blue light. A wavelength of the second light L2 may be shorter than a wavelength of the first light L1. Accordingly, the second light L2 may have higher energy than that of the first light L1.

When the display unit 312 emits light for more than a given amount of time, characteristics of the transistor included in the driving unit 311 may change, and a driving range of the transistor may increase. In this case, the second light L2 having relatively higher energy may be emitted from the light irradiation member 330, and may be irradiated to the transistor in the driving unit 311. Accordingly, the driving range of the transistor may decrease, and characteristics of the transistor may improve.

Figure 9:
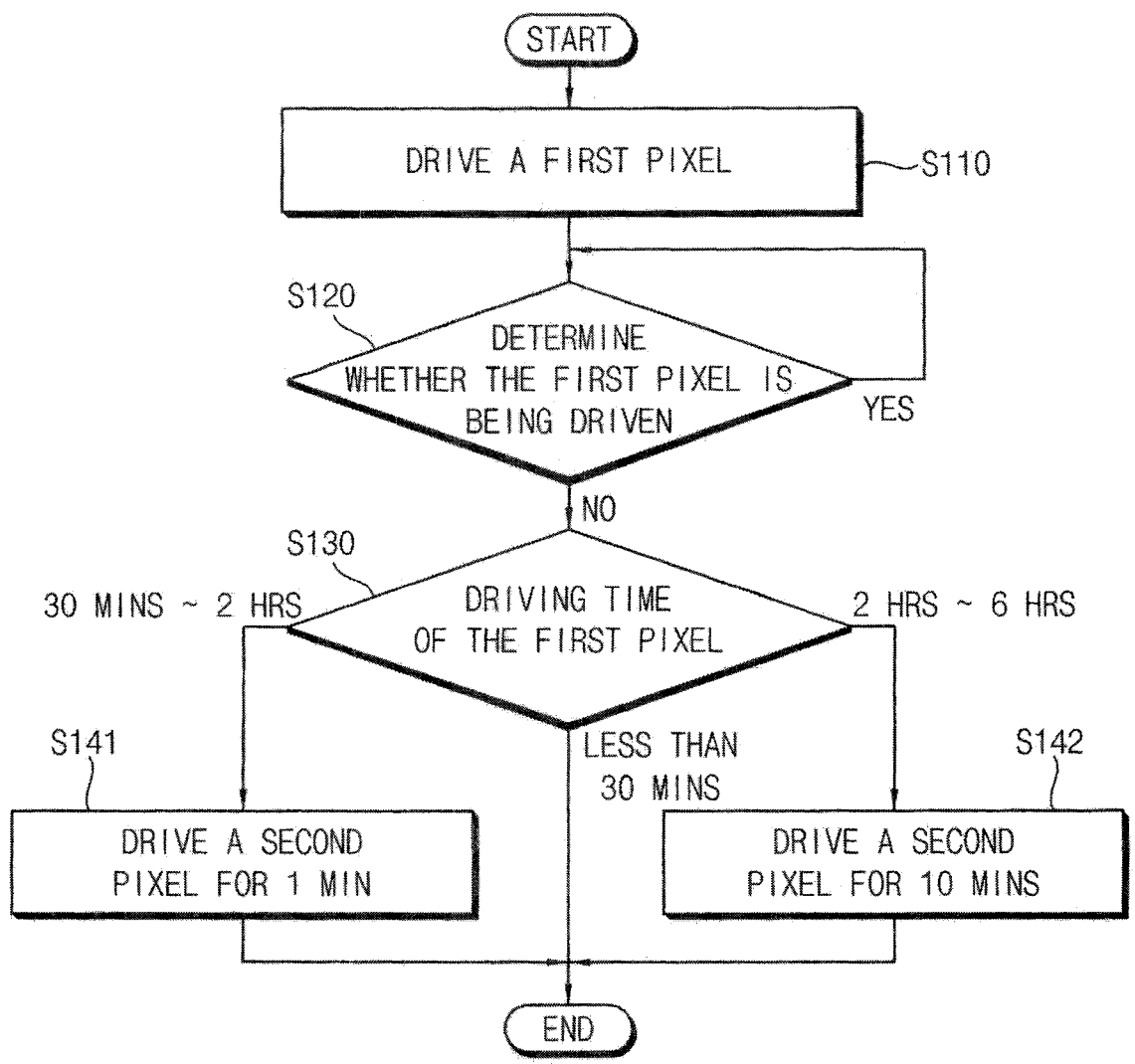
FIG. 9 is a flowchart illustrating a method of driving a display device according to an embodiment.

FIG. 9 is a flowchart illustrating a method of driving a display device according to an embodiment.

FIG. 9 may be a flowchart illustrating a driving method of the display device 100 in FIG. 2. However, the driving method in FIG. 9 may be applied to the display device 200 in FIG. 5 and the display device 300 in FIG. 7 with modification and change.

Referring to FIGS. 2 and 9, the first pixel PX1 may be driven (S110). For example, light may be emitted from the first light emitting element OLED1 by driving the first transistor TR1. The light emitted from the first light emitting element OLED1 may be red light, green light, or blue light, and may be emitted to the front of the display device 100. Therefore, a user may recognize an image.

Then, whether the first pixel PX1 is being driven may be determined (S120). When the first pixel PX1 is being driven, whether the first pixel PX1 is being driven may be determined again after a certain amount of time passes. When the first pixel PX1 is not being driven, it may proceed to an operation of determining a driving time of the first pixel PX1.

Then, the driving time of the first pixel PX1 may be determined (S130). If the driving time of the first pixel PX1 is greater than a given amount of time, or a predetermined time, the second pixel PX2 may be driven. For example, the given amount of time may be about 30 minutes.

For example, light may be emitted from the second light emitting element OLED2 by driving the second transistor TR2. The light emitted from the second light emitting element OLED2 may be emitted toward the front of the display device 100, and may be reflected by the reflective member 190. The light reflected by the reflective member 190 may be irradiated to the first transistor TR1. The light emitted from the second light emitting element OLED2 may be blue light, white light, or light having a wavelength that is shorter than a wavelength of blue light. The light emitted from the second light emitting element OLED2 may have a wavelength that is shorter than a wavelength of the light emitted from the first light emitting element OLED1, and may have higher energy than that of the light emitted from the first light emitting element OLED1. When the driving time of the first pixel PX1 is less than the given amount of time (e.g., about 30 minutes), then the second pixel PX2 might not be driven.

When the driving time of the first pixel PX1 is a first amount of time that is greater than the given amount of time, the second pixel PX2 may be driven for a second amount of time (S141). For example, when the driving time of the first transistor TR1 is the first amount of time, the second transistor TR2 may be driven for the second amount of time. For example, the first amount of time may be in a range from about 30 minutes to about 2 hours, and the second amount of time may be about 1 minute.

When the driving time of the first pixel PX1 is a third amount of time that is greater than the first amount of time, the second pixel PX2 may be driven for a fourth amount of time that is greater than the second amount of time (S142). For example, when the driving time of the first transistor TR1 is the third amount of time, the second transistor TR2 may be driven for the fourth amount of time. For example, the third amount of time may be in a range from about 2 hours to about 6 hours, and the fourth amount of time may be about 10 minutes. A magnitude of a driving time of the second pixel PX2 may be controlled depending on the driving time of the first pixel PX1. Therefore, characteristics of the first transistor TR1 may properly improve.

Figure 10:
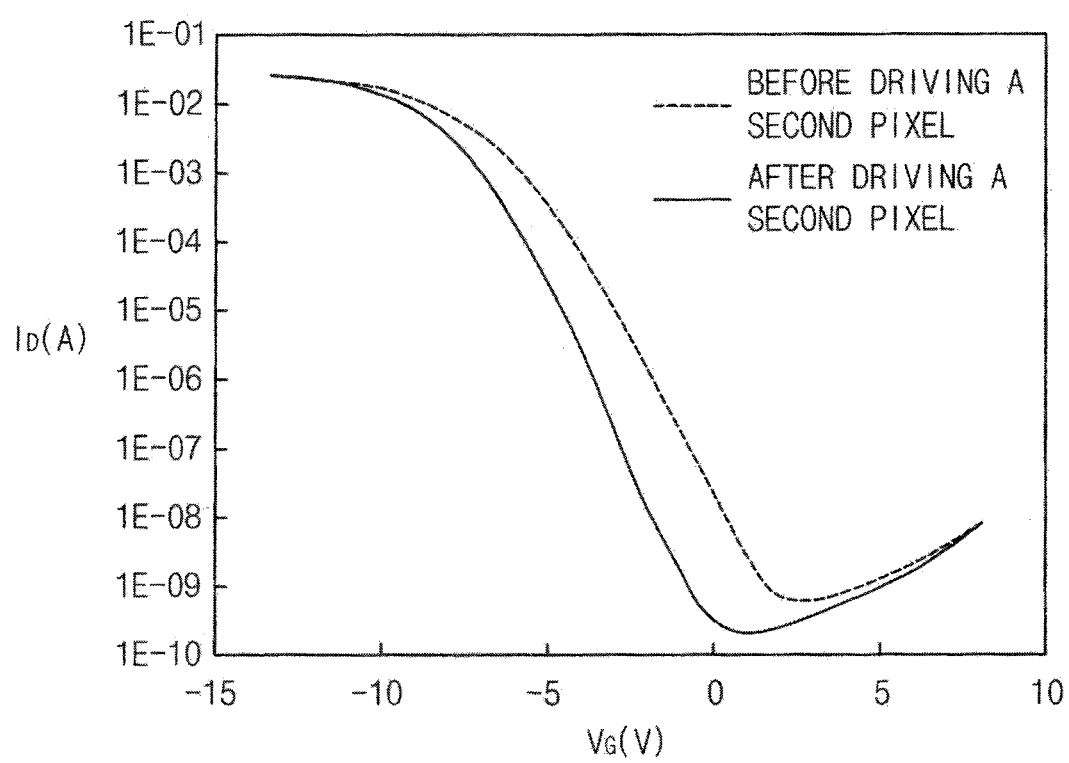
FIG. 10 is a graph illustrating a relationship between voltage and current of a first transistor.

FIG. 10 is a graph illustrating a relationship between voltage and current of the first transistor TR1.

Referring to FIG. 10, when the first pixel PX1 emits light for more than the predetermined time/given amount of time (in other words, before the second pixel PX2 is driven), characteristics of the first transistor TR1 may change. That is, a slope of a voltage-current curve of the first transistor TR1 may decrease, as illustrated in FIG. 10. Therefore, a driving range of the first transistor TR1 may increase. When the second pixel PX2 is driven, light emitted from the second pixel PX2 may be reflected by the reflective member 190, and may be irradiated to the first transistor TR1. Accordingly, the slope of the voltage-current curve of the first transistor TR1 may increase, and the driving range of the first transistor TR1 may decrease.

The display device according to the embodiments of the present invention may be applied to a display device included in a computer, a notebook, a mobile phone, a smartphone, a smart pad, a PMP, a PDA, an MP3 player, or the like.

Although the display devices and the methods of driving the display devices according to the described embodiments have been described with reference to the drawings, the illustrated embodiments are examples, and may be modified and changed by a person having ordinary knowledge in the relevant technical field without departing from the technical spirit of the present invention described in the following claims, with functional equivalents thereof to be included therein.

What is claimed is:

1. A display device comprising:
    a first pixel comprising a first transistor, and a first light emitting element on and electrically connected to the first transistor;
    a second pixel adjacent the first pixel, the second pixel comprising a second transistor, and a second light emitting element on and electrically connected to the second transistor; and
    a reflective member at a layer that is above the first pixel and the second pixel, the reflective member being configured to reflect a light emitted from the second light emitting element to the first transistor.

2. The display device of claim 1, wherein the reflective member overlaps the second pixel in a plan view.

3. The display device of claim 2, wherein the first pixel is a display pixel that displays an image, and
    wherein the second pixel is a dummy pixel that does not display an image.

4. The display device of claim 2, wherein the second pixel is configured to emit a blue light or a white light.

5. The display device of claim 2, wherein the second pixel is configured to emit a light having a wavelength that is shorter than a wavelength of a blue light.

6. The display device of claim 1, wherein the reflective member overlaps a non-emission area between the first pixel and the second pixel in a plan view.

7. The display device of claim 6, wherein each of the first pixel and the second pixel is a display pixel configured to display an image.

8. The display device of claim 6, wherein the second pixel is configured to emit a blue light.

9. The display device of claim 6, wherein a light emitted from the second light emitting element is reflected by the reflective member and irradiated to the second transistor.

10. The display device of claim 1, wherein the reflective member comprises a metal or a metal oxide.

11. The display device of claim 1, wherein a lower surface of the reflective member has an embossing pattern.

12. The display device of claim 11, further comprising a pixel defining layer separating the first light emitting element from the second light emitting element, and
    wherein an upper surface of the pixel defining layer has an embossing pattern.

13. The display device of claim 1, wherein each of the first transistor and the second transistor comprises:
    a gate electrode on a substrate;
    a semiconductor layer on, and insulated from, the gate electrode; and
    a source electrode and a drain electrode on, and electrically connected to, the semiconductor layer.

14. A method of driving a display device comprising a first pixel comprising a first transistor and a first light emitting element on and electrically connected to the first transistor, a second pixel adjacent to the first pixel and comprising a second transistor and a second light emitting element on and electrically connected to the second transistor, and a reflective member on the first pixel and the second pixel, the method comprising:
    driving the first transistor such that a light is emitted from the first light emitting element; and
    driving the second transistor such that a light emitted from the second light emitting element is reflected by the reflective member and irradiated to the first transistor.

15. The method of claim 14, further comprising driving the second transistor when a driving time of the first transistor is greater than a given amount of time.

16. The method of claim 15, wherein the given amount of time is about 30 minutes.

17. The method of claim 15, further comprising driving the second transistor for a first amount of time when the driving time of the first transistor is a second amount of time that is greater than the given amount of time.

18. The method of claim 17, wherein the first amount of time is about 1 minute, and
    wherein the second amount of time is in a range from about 30 minutes to about 2 hours.

19. The method of claim 17, further comprising driving the second transistor for a third amount of time that is greater than the first amount of time when the driving time of the first transistor is a fourth amount of time that is greater than the second amount of time.

20. The method of claim 19, wherein the third amount of time is about 10 minutes, and
    wherein the fourth amount of time is in a range from about 2 hours to about 6 hours.

* * * * *